US007400203B2

United States Patent
Ojo et al.

(10) Patent No.: US 7,400,203 B2
(45) Date of Patent: Jul. 15, 2008

(54) CIRCUIT WITH Q-ENHANCEMENT CELL HAVING FEEDBACK LOOP

(75) Inventors: Adedayo Ojo, San Diego, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 72 days.

(21) Appl. No.: 11/590,452

(22) Filed: Oct. 31, 2006

(65) Prior Publication Data

US 2008/0030279 A1 Feb. 7, 2008

Related U.S. Application Data

(63) Continuation-in-part of application No. 11/510,373, filed on Aug. 25, 2006.

(60) Provisional application No. 60/835,482, filed on Aug. 3, 2006.

(51) Int. Cl.
    H03F 3/04 (2006.01)
(52) U.S. Cl. .................... 330/305; 330/260; 330/261
(58) Field of Classification Search ............... 330/305, 330/260, 261
    See application file for complete search history.

(56) References Cited

U.S. PATENT DOCUMENTS

| | | | | |
|---|---|---|---|---|
| 4,843,343 A * | 6/1989 | Pace | | 330/257 |
| 6,621,331 B2 * | 9/2003 | Pobanz et al. | | 327/568 |
| 6,724,259 B2 * | 4/2004 | Tanabe | | 330/285 |
| 6,765,377 B1 | 7/2004 | Lu | | |
| 6,870,447 B2 * | 3/2005 | Kawai | | 333/217 |
| 7,042,317 B2 * | 5/2006 | Xiao et al. | | 333/214 |
| 7,259,625 B2 * | 8/2007 | Sanderson | | 330/253 |
| 2003/0054783 A1 | 3/2003 | Mason | | |
| 2005/0184314 A1 | 8/2005 | Ward et al. | | |

OTHER PUBLICATIONS

Kulyk, Jim M., "A Monolithic CMOS Transformer Based Q-Enhanced Series-C Coupled Resonator Bandpass Filter", *The University of Calgary*, Calgary, Alberta. A Thesis Submitted to the Faculty of Graduate Studies in Partial Fulfillment of the Requirements for the Degree of Master of Science, Department of Electrical and Computer Engineering, (Jan. 2006), 150.

* cited by examiner

*Primary Examiner*—Patricia Nguyen
(74) *Attorney, Agent, or Firm*—Brake Hughes Bellerman LLP

(57) ABSTRACT

According to an example embodiment, an amplitude feedback loop may include an RF amplifier, a detector, a comparator, and a Q-enhancement cell. In an example embodiment, the RF amplifier has an output signal, and the detector has an input coupled to the output signal of the RF amplifier and is configured to detect a level of the output signal of the RF amplifier. The comparator circuit may receive as inputs a reference voltage and the output of the detector. Also, the comparator circuit is configured to output a control signal based on a difference between the reference voltage and the output signal of the power detector. The Q-enhancement cell may be coupled to the RF amplifier and have an input coupled to an output of the comparator circuit. A bias current of the Q-enhancement cell may be adjusted based on the control signal output by the comparator circuit.

19 Claims, 5 Drawing Sheets

110 RF Amplifier with Q-Enhancement Cell

CIRCUIT WITH Q-ENHANCEMENT CELL HAVING FEEDBACK LOOP

CROSS-REFERENCE TO RELATED APPLICATIONS

This application is a continuation-in-part of U.S. patent application Ser. No. 11/510,373, filed on Aug. 25, 2006, entitled "Circuit with Q-Enhancement cell Having Programmable Bias Current Slope," hereby incorporated by reference. This application also claims priority to U.S. Provisional application Ser. No. 60/835,482, filed on Aug. 3, 2006, entitled "Circuit with Q-Enhancement cell Having Programmable Bias Current Slope," hereby incorporated by reference.

BACKGROUND

Wireless transceivers and other circuits are used in a wide variety of wireless and communication systems. A wireless transceiver may typically include a wireless receiver for receiving and demodulating signals, and a transmitter for modulating signals for transmission. The transceiver may typically include a variety of RF (radio frequency) circuits, such as amplifiers, mixers, filters, LO (local oscillator) circuits, etc. The RF amplifiers typically have to operate over wide frequency bandwidths. Channel selection within these frequency bandwidths often results in poor performance at the upper and lower frequencies within the bandwidth.

SUMMARY

Various embodiments are disclosed relating to Q-enhancement cells.

In one example embodiment, an amplitude feedback loop comprises an RF amplifier, a detector, a comparator, and a Q-enhancement cell. In an example embodiment, the RF amplifier has an output signal, and the detector has an input coupled to the output signal of the RF amplifier and configured to detect a level of the output signal of the RF amplifier. The comparator circuit may be coupled to receive as inputs a reference voltage and the output of the detector, and the comparator circuit may be configured to output a control signal based on a difference between the reference voltage and the output signal of the power detector. The Q-enhancement cell may be coupled to the RF amplifier and have an input coupled to an output of the comparator circuit. A bias current of the Q-enhancement cell may be adjusted based on the control signal output by the comparator circuit.

Another example embodiment is a method comprising determining a signal level of an RF amplifier output, comparing a reference voltage to the determined signal level of the RF amplifier output, and adjusting a bias current of a Q-enhancement cell coupled to the RF amplifier based on the comparing in order to maintain the signal level of the RF amplifier at a specific level.

DETAILED DESCRIPTION

Figure 1:
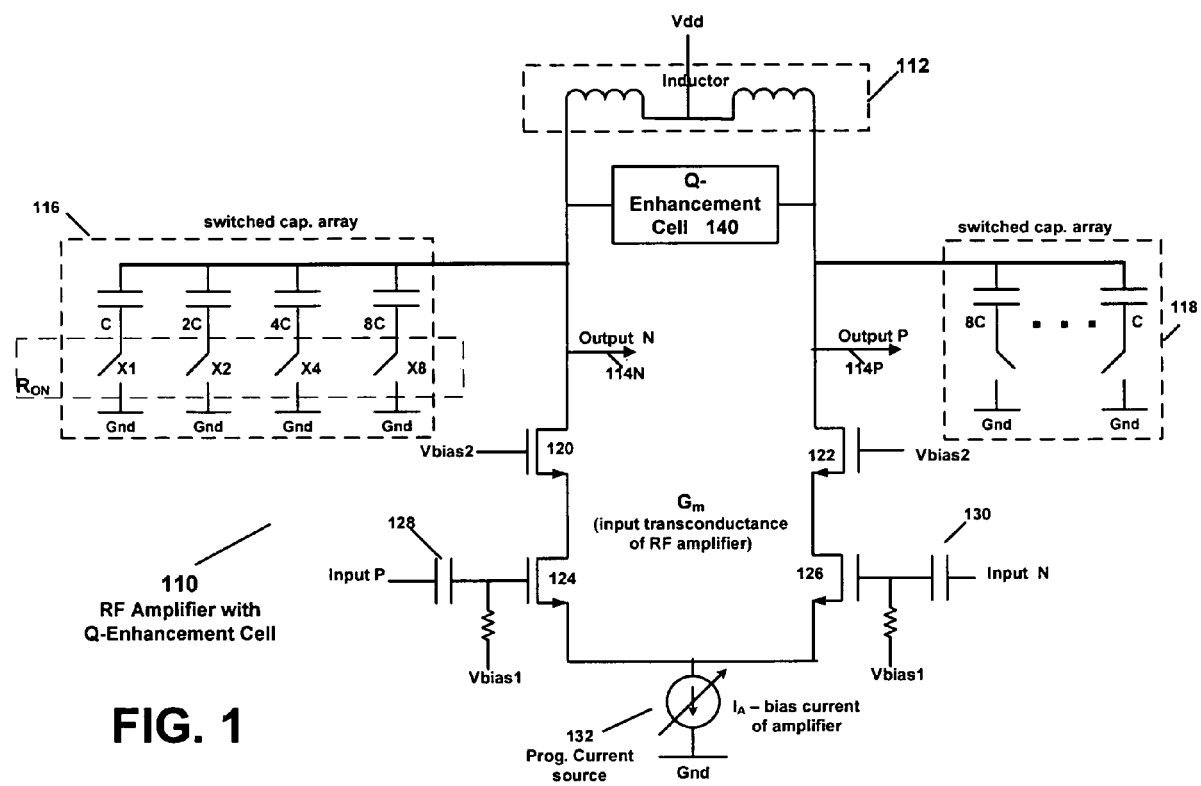
FIG. 1 is a circuit diagram of an amplifier circuit according to an example embodiment.

FIG. 1 is a block diagram of an amplifier circuit according to an example embodiment. The amplifier 110 in FIG. 1 is merely an example circuit used to illustrate some operation and features of an example embodiment. The various techniques and features described in this disclosure may apply to a wide variety of circuits, and an amplifier is merely one example circuit where these techniques may be applied.

Amplifier 110 may be a differential amplifier, e.g., may include differential (e.g., positive and negative) inputs and may include differential outputs, and may be an RF amplifier in an example embodiment. Amplifier 110 may include cascode devices or transistors 120 and 122. A bias voltage (Vbias2) may be applied to the gates of both cascode transistors 120 and 122. Amplifier 110 may also include a transistor 128 coupled in series with cascode transistor 120, and a transistor 126 coupled in series with cascode transistor 122. A positive input (input P) may be applied to the gate of transistor 124 via a capacitor 128. A bias voltage (Vbias1) is also applied to the gate of transistor 124 via a resistor. Similarly, a negative input (input N) is applied to the gate of transistor 126 via a capacitor 130. A bias voltage (Vbias1) is applied to the gate of transistor 126 via a resistor. Transistors 120, 122, 124, and 126 may be MOSFETs (Metal Oxide Semiconductor Field-Effect Transistors), according to an example embodiment.

In addition, the amplifier 110 may include a variable or programmable current source 132 coupled in series between transistors 124/126 and ground. The current source 132 may provide a variable bias current $I_A$ for the amplifier 110. According to an example embodiment, current source 132 may be implemented, for example, as an IDAC (or programmable current digital-to-analog converter), which may receive a digital control signal and generate a current, $I_A$, based on the digital control signal. Other implementations may be used as well.

Switched capacitor arrays 116 and 118 may be coupled to output lines 114N and 114P, respectively, to provide variable capacitors. Switched capacitor arrays 116, 118 may each include one or more switched capacitors (e.g., one or more capacitors coupled to ground via a switch), to allow the amplifier to be tuned to operate at one of a plurality of channels or center frequencies, for example.

For example, as shown in FIG. 1, switched capacitor array 116 may include a capacitor of capacitance C coupled to ground via a switch X1, a capacitor of capacitance 2C coupled to ground via a switch X2, a capacitor of capacitance 4C coupled to ground via a switch X4, and a capacitor of capacitance 8C coupled to ground via a switch X8. This may be considered a binary weighted capacitor array, where a wide range of capacitance values may be obtained by selectively opening and closing switches X1, X2, X4, X8, e.g., based on a digital control signal. Each of the switches may be implemented as a MOS (metal oxide semiconductor) transistor, for example. As a result, each of the switches may introduce a resistance when closed or On, and the total resistance of the group of one or more On switches may be referred to as $R_{ON}$. Capacitor array 118 may be the same or similar to the capacitor array 116, according to an example embodiment.

In addition, the amplifier 110 may include an inductor 112, which may be a differential inductor to operate as an inductor load for amplifier 112, for example. Inductor 112 may include an inductance L, and a Quality Factor (Q). The inductor 112 may include a loss component (as part of the inductor) that may be shown as a resistor (or resistance), which may be referred to as Rp, e.g., which may reflect a resistance in parallel with the inductance L for inductor 112.

In operation of amplifier 110, transistors 124 and 126 may provide amplification of input signals (input P, input N), and may output a differential output signals, including a negative output (output N) via line 114N, and a positive output (output P) via line 114P. Cascode transistors 120 and 122 may provide isolation between the input and output terminals. Transistors 124 and 126 may operate as a transconductor. The amplifier 110, via transistors 124 and 126, and current source 132, may include an input transconductance, referred to as Gm.

A transconductor, Gm, may, for example, generate an output current based on an input voltage, such as: $I_{out}=V_{in}*Gm$.

The gain of amplifier 110 may be represented as: Gain=Gm*Rp, where Gm is the input transconductance of the amplifier and Rp is the equivalent parallel resistance due to the resistive loss of the inductor 112.

In an example embodiment, it may be desirable to increase a gain of the amplifier 110, e.g., double the gain. This is merely an example. The size of the inductor 112 may be set or limited by the chip area. In an example embodiment, as a rough approximation, a Q of inductor 112 may be roughly proportional to the size of inductor 112. This inductor size may therefore set the Q (or Quality Factor) for inductor 112.

The parallel resistance of the inductor, Rp, may be represented as: Rp=QwL, where Q is the Quality Factor of the inductor 112, w is the operating frequency, and L is the inductance of the inductor 112. Therefore, the Q and L of the inductor 112 may be fixed (or may not typically be increased), e.g., due to space constraints for the circuit and/or the effective capacitive loading presented to the RF amplifier. Another way to represent this, is first one may select an inductance value or L. The selection of L may be based on the effective loading presented to the RF amplifier, such that w (operating frequency)=1/[2*pi*sqrt(L*Ceff)]. The effective loading capacitance (Ceff) may represent all layout parasitic capacitance, loading due to preceding stages as well as the total capacitance required for tuning across different frequency bands. Next, the Q will be set based on the available area for the inductor. Because the operating frequency is set (e.g., constant or within a range of frequencies), the Rp for the inductor is therefore fixed, in this example.

In addition, the input transconductance (Gm) of the amplifier 110 may be roughly proportional to the square root of the amplifier bias current ($I_A$), for example. Therefore, if in this example, the Rp is fixed, the gain of the amplifier may be increased by increasing only the Gm. For example doubling the amplifier Gain may be achieved by doubling the Gm. E.g., doubling the Gm may double the Gain of the amplifier 110, which may be represented as: 2*Gm>2*Gain. However, because the Gm may be roughly proportional to the square root of the amplifier bias current ($I_A$), doubling the Gm may be achieved by quadrupling the bias current ($I_A$). For example: 2*Gm may be achieved by 4*$I_A$. Quadrupling the bias current of the amplifier 110 may be done, in some situations, but may typically lead to the undesirable result of significantly increasing power consumption for the amplifier. For example, in such a case, a 2 mA bias current (as an example) may be quadrupled to 8 mA, which may be an undesirable result for low power applications. Thus, if possible, at least in some situations, it may be more desirable to increase the Gm without significantly increasing the bias current ($I_A$).

Therefore, it is desirable to increase the Q of the inductor (e.g., to increase Gain or performance), but there may be a limited size or circuit area for the inductor that may typically constrain or limit Rp for the inductor. Therefore, as noted above, one way to increase the Gain may be through increasing the Gm (e.g., by increasing the bias current), but this may have an undesirable effect of increasing power.

Therefore, according to an example embodiment, the Q of the inductor 112 may be increased or enhanced by using a Q-enhancement cell 140 to increase the effective resistance of the inductor 112 or the circuit.

Figure 2:
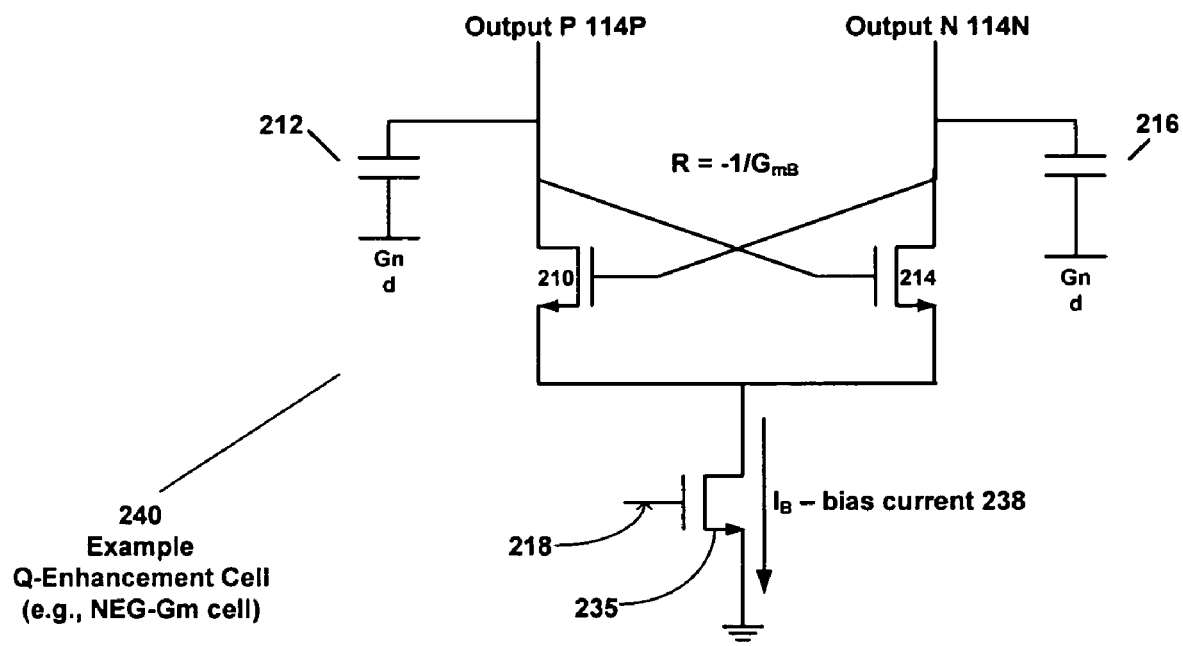
FIG. 2 is a circuit diagram illustrating a Q-enhancement cell according to an example embodiment.

When the Q-enhancement cell 140 is coupled to the amplifier 110, e.g., across the differential outputs 114N and 114P of the amplifier 110, the effective Gain (or enhanced Gain) of amplifier 110 may be represented as: $Gain_{eff}=Gm*R_{eff}$, where $R_{eff}$ is the effective resistance from Rp in combination with the Q-enhancement cell 140. By adding the additional resistance provided by the Q-enhancement cell 140, the overall Q for the amplifier 110 may be increased. Thus, by coupling the Q-enhancement cell 140 to the outputs of the amplifier 110, the effective output resistance ($R_{eff}$) of the amplifier is increased, which increases the amplifier Gain, e.g., without drastically increasing the bias current $I_A$. The additional current required by the Q-Enhancement cell 140, namely the bias current $I_B$ 238 discussed with reference to FIG. 2, is typically fraction of the main RF amplifier bias current $I_A$ generated by the programmable current source 132.

As noted above, the Gain of the amplifier 110 may be represented as: Gain=Gm*Rp. The enhanced or effective Gain of the amplifier 110 with the benefit of the Q-enhancement device may be represented as $Gain_{eff}=Gm*R_{eff}$, where $R_{eff}$ is the effective resistance from Rp in combination with the Q-enhancement cell 140. For the new or effective Gain (with Q-enhancement cell 140) to be, say, twice as much as the original Gain (without Q-enhancement cell), then the effective resistance ($R_{eff}$) of the inductor 112 should be twice as much as the original parallel resistance (Rp) of the inductor 112. This may be represented as $R_{eff}=2*Rp$.

According to an example embodiment, the Q-enhancement cell 140 may be provided as a negative Gm (NEG-Gm) cell, having a negative resistance that may be represented as: $-1/g_{mB}$, where $g_{mB}$ is the transconductance of the NEG-Gm cell (or Q-enhancement cell 140). Therefore, in an example embodiment, when the Q-enhancement cell, having a resistance of: $-R=-1/g_{mB}$ is placed in parallel to the inductor resistor Rp, the effective resistor (or effective resistance) may be represented as: $R_{eff}=Rp//[-R]$, where $-R=-1/g_{mB}$. Thus, solving for $R_{eff}$ provides: $R_{eff}=Rp/(1-g_{mB}*Rp)$. If, for example, the effective resistance $R_{eff}$ will be twice the resistance of Rp (e.g., in order to provide twice the gain), then: $R_{eff}=Rp/(1-g_{mB}*Rp)=2Rp$. This equation may be solved to obtain a transconductance of $g_{mB}=\frac{1}{2}Rp$. This value of transconductance of the Q-enhancement cell 140 may be obtained by using or selecting a bias current of the Q-enhancement cell 140, e.g., around 200 μA-400 μA, as an example. This is described in more detail below with respect to FIG. 2.

Thus, the Gain of the amplifier 110 may be doubled by using a Q-enhancement cell, with the additional cost of a small current increase, e.g., 200 μA-400 μA, which is a much smaller current increase than quadrupling the amplifier bias current $I_A$, e.g., from 2 mA to 8 mA, as an example.

FIG. 2 is a circuit diagram illustrating a Q-enhancement cell according to an example embodiment. Q-enhancement cell 240 may be, for example, a negative Gm (NEG-Gm) cell, according to an example embodiment. The Q-enhancement cell 240 may be coupled between the differential outputs 114P, 114N. NEG-Gm cell 240 may include transistors 210 and 214 coupled in parallel. Gates of transistors 210 and 214 may be cross-coupled to outputs 114N and 114P, respectively. Transistors 210 and 214 are coupled to a drain of a transistor 210 which, in an example embodiment, is a MOSFET. The Q-enhancement cell 240, configured as a NEG-Gm cell, may include a resistance $R=-1/g_{mB}$, for example. This illustrates an example of a Q-enhancement cell, and other Q-enhancement cells may be used.

According to an example embodiment, the Q-enhancement cell 140 may be provided as a negative Gm (NEG-Gm) cell, having a negative resistance that may be represented as: $-1/g_{mB}$, where $g_{mB}$ is the transconductance of the NEG-Gm cell (or Q-enhancement cell 140). Therefore, in an example embodiment, when the Q-enhancement cell, having a resistance of: $-R=-1/g_{mB}$ is placed in parallel to the inductor resistor Rp, the effective resistor (or effective resistance) may be represented as: $R_{eff}=Rp//[-R]$, where $-R=-1/g_{mB}$. Thus, solving for $R_{eff}$ provides: $R_{eff}=Rp/(1-g_{mB}*Rp)$. If, for example, the effective resistance $R_{eff}$ will be twice the resistance of Rp (e.g., in order to provide twice the gain), then: $R_{eff}=Rp/(1-g_{mB}*Rp)=2Rp$. This equation may be solved to obtain a transconductance of $g_{mB}=\frac{1}{2}Rp$. This value of transconductance of the Q-enhancement cell 140 may be obtained by using or selecting a bias current 238 of the Q-enhancement cell 140, e.g., around 200 µA-400 µA, as an example.

Figure 3:
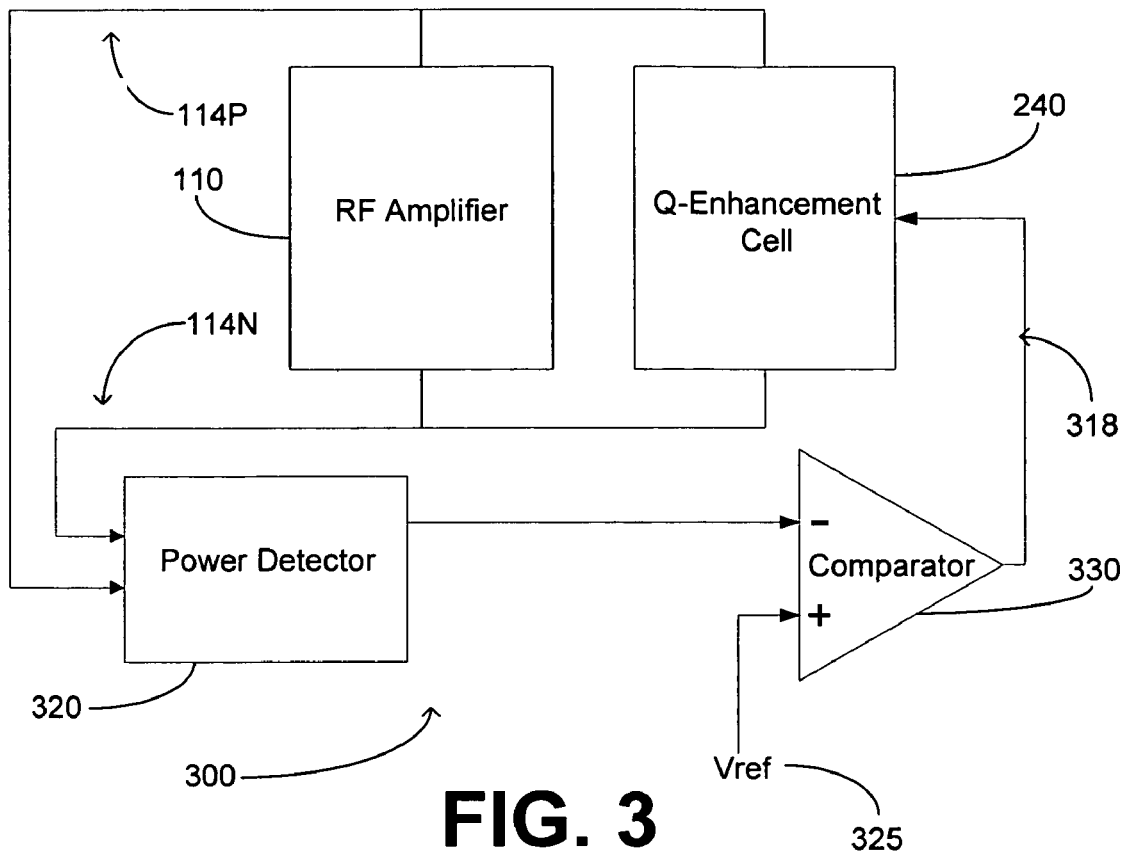
FIG. 3 is a block diagram of a continuous time amplitude control loop according to an example embodiment.

FIG. 3 is a block diagram of a continuous time amplitude control loop 300 according to an example embodiment. In the example embodiment shown in FIG. 3, the amplitude control loop includes the amplifier 110, which may be an RF amplifier, with an output (such as differential outputs for example) coupled to a power detector 320 and to a Q-enhancement cell 240. The output of the amplifier 110 may be a differential output, and may include the positive output 114P and the negative output 114N. The output of the amplifier 110 may be coupled to an input of a power detector 320. The power detector 320 may take an output, such as a differential output, of the amplifier 110, and provide an output based on a known transfer function. In an example embodiment, the output may be a DC Voltage proportional to the differential output voltage of the RF amplifier. The output of the power detector 320 may be coupled to a negative terminal of a comparator 330. A positive terminal of the comparator 330 may be coupled to a reference voltage 325. The comparator 330 may then output a difference voltage 318, which may be based upon a difference between the power detector 320 output and the reference voltage 325, to the Q-enhancement cell 140. The difference voltage 318 may be coupled to the gate 218 of the MOSFET 235 of the Q-enhancement cell 240 shown in FIG. 2. The difference voltage 318 may thereby control the bias current 238 of the Q-enhancement cell 240, which in turn controls the negative resistance due to the Q-enhancement cell 240. The Q-enhancement cell's 140 coupling with the amplifier 110, changes the overall output and/or gain of the amplifier 110, as discussed above. Thus, the amplitude control loop 300 may cause the output of the amplifier 110 to maintain a constant differential output voltage. This constant differential voltage may be adjusted by adjusting the reference voltage 325.

The amplitude loop may control the output 114N, 114P, of the amplifier 110 by controlling the bias current 238 of the Q-enhancement cell 140. If the reference voltage 325 becomes greater than the output of the power detector 320, then the difference voltage 318 may increase, increasing the bias current 238, which increases the effective negative resistance of the Q-enhancement cell 140, which increases the amplitude of the amplifier 110. If the reference voltage 325 becomes less than the output of the power detector 320, then the opposite chain of events may occur, decreasing the amplitude of the amplifier 110. The difference voltage 318 of the comparator 330 may have steady-state value when the reference voltage 325 and the power detector output 320 are equal. This steady-state value may be, for example, a voltage other than zero, which allows the bias current 238 to maintain a steady-state value. The outputs 114N, 114P may be controlled by a fixed amplitude of the reference voltage 325; a given reference voltage 325 may correspond to a given output 114N, 114P of the amplifier 110. The level or amplitudes of outputs 114N, 114P of the amplifier 110 may be varied by controlling the bias current 238 to change the negative resistance of the Q-enhancement cell 140. The amplitude feedback loop 300 may also cause the amplifier 110 output to remain constant across frequency channels, which may have application in wireless applications. The amplitude feedback loop in this scenario may compensate for Q degradation due to channel selection (switched capacitor array finite Ron) as well as Q degradation due to inductor Q frequency response.

Figure 4:
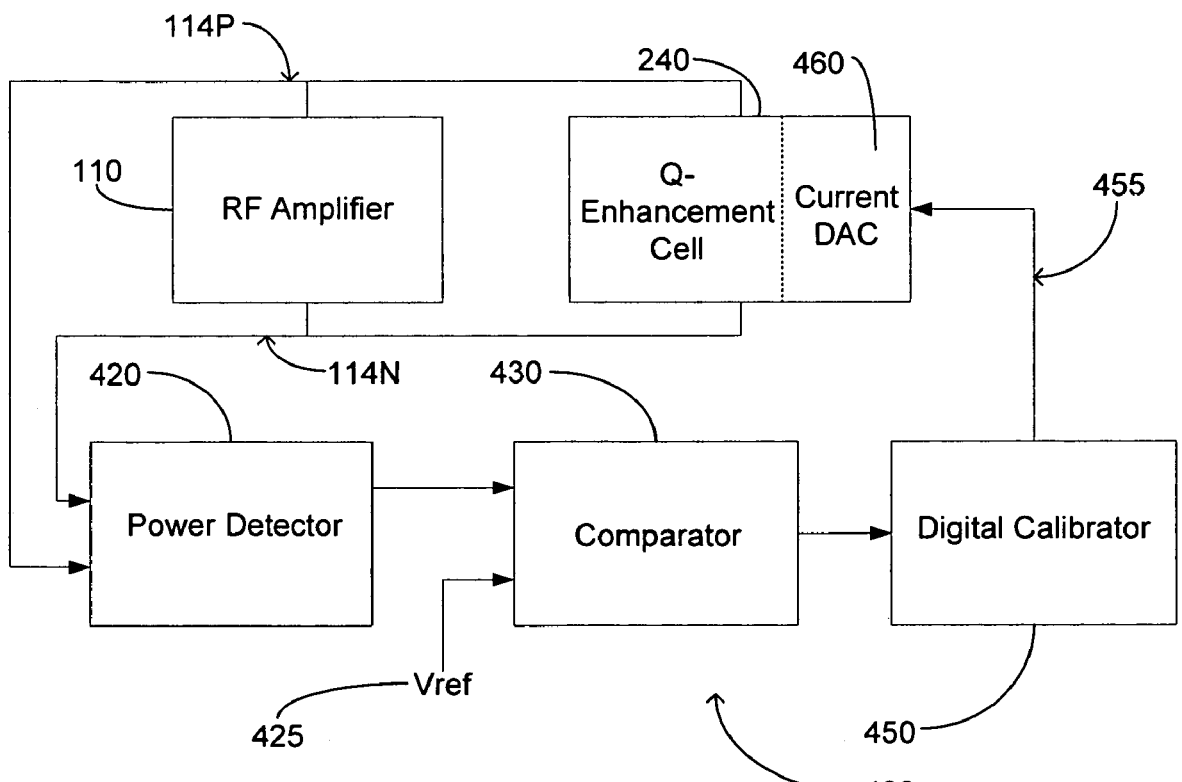
FIG. 4 is a block diagram of a digital amplitude control loop according to an example embodiment.

FIG. 4 is a block diagram of a digital amplitude control loop 400 according to an example embodiment. In the example embodiment shown in FIG. 4, the digital amplitude control loop 400 includes an amplifier 110, which may be an RF amplifier, with an output coupled to a power detector 420 and to a Q-enhancement cell 240. As in the analog amplitude control loop 300, the output of the amplifier 110 may be a differential output, and may include the positive output 114P and the negative output 114N. The output of the amplifier 110 may be coupled to an input of a power detector 420. An output of the power detector 420 may be coupled to a first input of a comparator 430. A second input of the comparator 430 may be coupled to a reference voltage 425. The reference voltage 425 may, in an example embodiment, be a programmable reference voltage which remains constant independent of changes in temperature, process, or supply. Where the reference voltage 425 is programmed to remain constant independent of changes in temperature, process, or supply, the output of the amplifier 110 may also remain constant independent of changes in temperature, process, or supply.

The comparator 430 may then output a difference voltage, which is based on a difference between the power detector 420 output and the reference voltage 425, to a digital calibrator 450. The digital calibrator 450 may then convert the difference voltage into a digital voltage representation 455 (or digital signal). Digital voltage representation 455 may be, for example, an N-bit digital signal. The digital voltage representation 455 may be a binary number indicating the difference voltage (e.g., difference between Vref and output of power detector 420) in one example embodiment, or in another example embodiment, may be a digital value of one where the power detector 420 output is less than the reference voltage 425 or a digital value of zero where the power detector 420 output is greater than the reference voltage 425, as an example. The digital voltage representation 455 may be coupled to a current digital-to-analog converter (current DAC) 460 of the Q-enhancement cell 240. The current digital-to-analog converter 460 may adjust the bias current 238 of the Q-enhancement cell 140 based on the digital voltage representation 455 (digital signal). As discussed above, the bias current 238 may control the Gain of the Q-enhancement cell 240 and, because of the Q-enhancement cell's 240 coupling to the amplifier 110, the digital voltage representation controls the output of the amplifier 110. Thus, the digital amplitude control loop 400 may cause the output of the amplifier 110 to maintain a constant value. This constant value may be adjusted by adjusting the reference voltage 425. Where, according to an example embodiment, the reference voltage 425 may be programmed to remain substantially constant independent of changes in temperature, process, or supply. Therefore, based on a particular reference voltage, in an example embodiment, the output of the amplifier 110, for example, may also remain substantially constant independent of changes in temperature, process, or supply, e.g., depending on the sensitivity of the power detector 420 to changes in temperature, process, or supply. The digital amplitude feedback loop 400 may also cause the amplifier 110 output to remain constant across frequency channels, which may have application in wideband wireless applications.

This digital amplitude control loop 400 may allow control of the outputs 114N, 114P of the RF amplifier 110 by changing the reference voltage 425 in the same manner as that described for the amplitude control loop 300. However, the control loop 400 in FIG. 4 may be considered a digital or discrete control loop that relies on digital values or digital control, whereas the control loop 300 of FIG. 3 is an example of a continuous time analog control loop.

According to an alternative embodiment, a multiplexer may be provided to allow a selection of either a discrete approach (discrete or digital control loop), such as the example described with reference to FIG. 4, or an analog approach (analog control loop), such as the example described with reference to FIG. 3, as examples.

Figure 5:
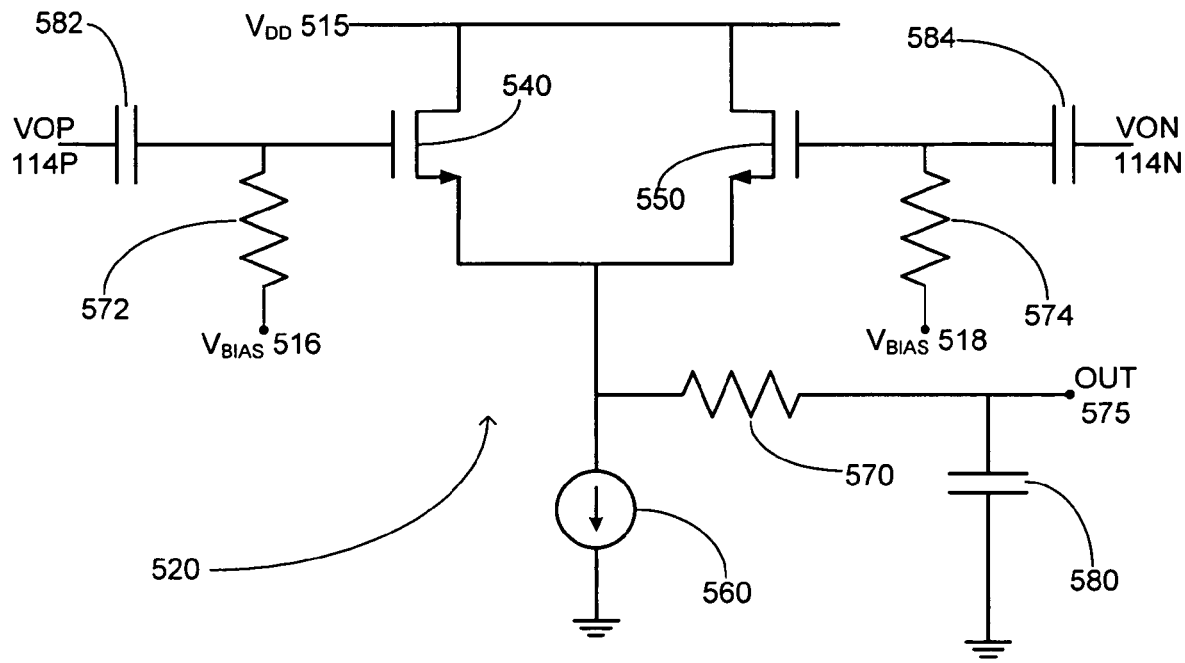
FIG. 5 is a circuit diagram of a power detector according to an example embodiment.

FIG. 5 is a circuit diagram of a power detector 520 according to an example embodiment. In the example embodiment shown in FIG. 5, two transistors 540, 550, which may be MOSFETs, may be coupled in parallel between a supply voltage 515 and a current source 560. A resistor 570 may be coupled between an output node 575, and the common node between the transistors 540, 550 and the current source 560. A capacitor 580 may be coupled between the output node 575 and ground, stabilizing the voltage at the output node 575.

The differential outputs 114P, 114N may serve as inputs to the power detector 520 shown in FIG. 5. In this power detector 520, a capacitor 582 may be coupled between a gate of the transistor 540 and the positive output 114P of the amplifier 110, and a resistor 572 may be coupled between a bias voltage 516 and the gate of the transistor 540. The bias voltage 516 biases the voltage level seen by the gate of the transistor 540, and the capacitor 582 stabilizes the voltage level when the positive output 114P fluctuates. On the other side of the power detector 520, a capacitor 584 may be coupled between a gate of the transistor 540 and the negative output 114N of the amplifier 110, and a resistor 574 may be coupled between a bias voltage 518 and the gate of the transistor 550. The power detector 520 shown in FIG. 5 may serve as a differential envelope detector amplifier, producing a voltage at the output node 575 that is a known transfer function of the positive output 114P and the negative output 114N, such as approximately equal to the absolute value of the differential inputs with a DC shift $V_{gs}$. Some embodiments of this power detector 520 may have a transfer function that varies with changes with process or temperature variations. Other embodiments may utilize the power detector 620 shown in FIG. 6 to eliminate process and temperature variations.

Figure 6:
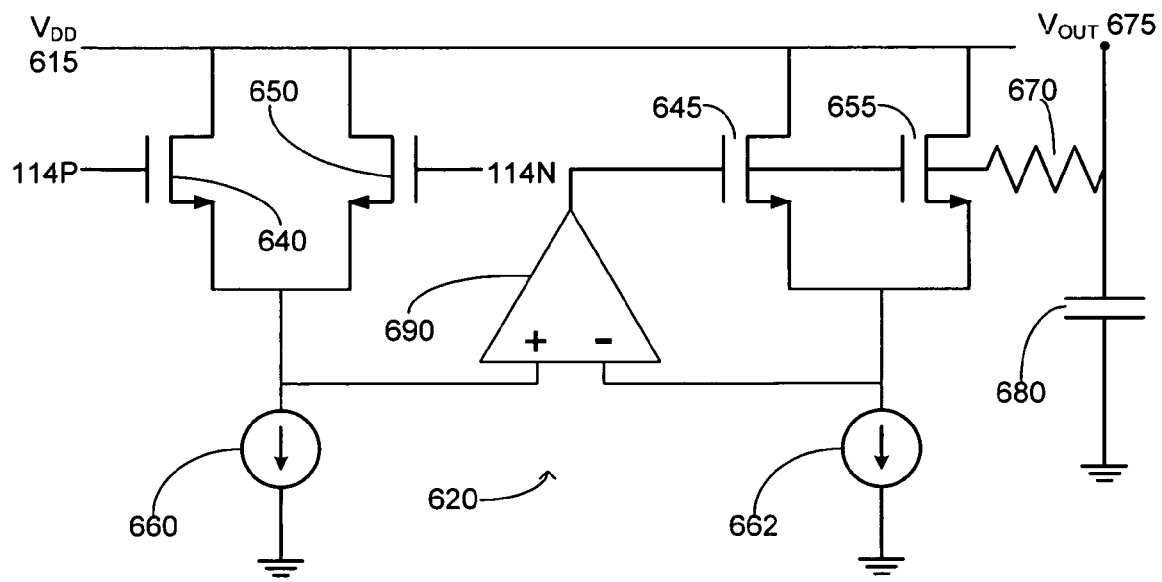
FIG. 6 is a circuit diagram of an alternative power detector according to an example embodiment.

FIG. 6 is a circuit diagram of a power detector 620 according to another example embodiment. This example embodiment may utilize two differential voltage followers and a feedback amplifier 690, also forming a differential envelope detector amplifier. This power detector 620 may maintain a constant output independent of variations temperature. In this example embodiment, as in the example embodiments shown in FIG. 5, a pair of transistors 640, 650, which may be MOSFETs, may be coupled between a voltage source 615 and a current source 660. The differential outputs 114P, 114N may serve as inputs to the power detector 620. A gate of each of said transistors 640, 660, may be controlled by the positive output 114P and the negative output 114N of the amplifier 110.

The example power detector 620 shown in FIG. 6 may further include a second pair of transistors 645, 655, which may also be MOSFETs, coupled between the voltage source 615 and a second current source 662. A body of one transistor 645 may be coupled to a gate of another transistor 655. A gate of the transistor 645 may be coupled to an output of the feedback amplifier 690. A positive terminal of the feedback amplifier 690 may be coupled between the transistors 640, 650 and the current source 660; a negative terminal of the feedback amplifier 690 may be coupled between the second pair of transistors 645, 655, and the second current source 662. A resistor 670 may be coupled between a body of the transistor 655 and an output node 675, and a capacitor 680 may be coupled between the output node 675 and ground.

The feedback amplifier 690 may keep the voltage levels at the positive and negative terminals of the feedback amplifier 690 equal by driving the gates of the transistors 645, 655 to the envelope of the differential signals. Thus, the feedback amplifier 690 may provide first-order cancellation of the DC voltage and distortion due to the transistors 640, 650. The output of the power detector 620 may be filtered to provide better averaging, as defined by a bandwidth of a filter. This power detector 620 may provide an output based on a transfer function of the amplifier output 114N, 114P, wherein the transfer function is independent of process or temperature variations.

Figure 7:
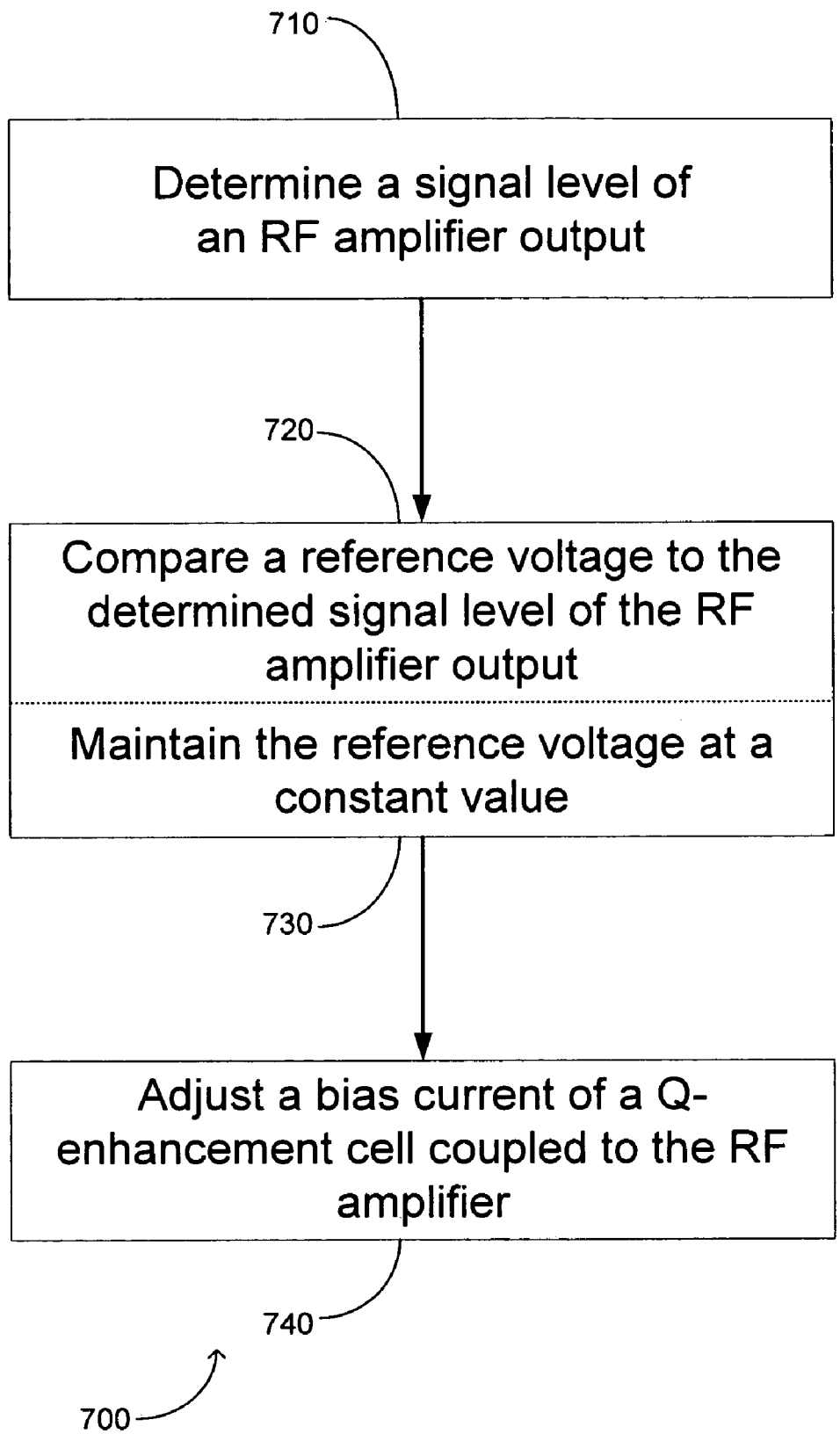
FIG. 7 is a flow chart showing a method of maintaining a signal level according to an example embodiment.

An example method 700 of controlling a signal level of an RF amplifier is shown in FIG. 7. As shown in block 710, one may determine a signal level of an RF output. Determining the signal level of the RF amplifier output may include receiving a differential output from the RF amplifier. As shown in block 720, one may compare a reference voltage (which may be substantially independent of process and temperature, for example) to the determined signal level of the RF amplifier output. For example, the comparing the reference voltage to the determined signal level of the RF amplifier output may be substantially independent of temperature variations, e.g., due to the reference voltage that may be substantially independent of process and temperature, according to an example embodiment. As shown in block 730, the reference voltage may be maintained independent of temperature or process. As shown in block 740, one may adjust a bias current of a Q-enhancement cell coupled to the RF amplifier based on the comparing in order to maintain the signal level of the RF amplifier at a specific level. The adjusting the bias current may include quantizing an output that is based on the comparing the reference voltage, or may include applying a voltage to a MOSFET.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:

an RF amplifier having an output signal;

a detector having an input coupled to the output signal of the RF amplifier and configured to detect a level of the output signal of the RF amplifier;

a comparator circuit coupled to receive as inputs a reference voltage and the output of the detector, the comparator circuit configured to output a control signal based on a difference between the reference voltage and the output signal of the power detector; and a Q-enhancement cell coupled to the RF amplifier, the Q enhancement cell having an input coupled to an output of the comparator circuit, wherein a bias current of the Q-enhancement cell is adjusted based on the control signal output by the comparator circuit.

2. The apparatus of claim 1 wherein the Q-enhancement cell includes a negative transconductor (NEG-Gm) cell.

3. The apparatus of claim 2 wherein the RF amplifier includes:

an inductor with a quality factor (Q);
one or more switched capacitors coupled to the inductor;
an input transconductor including first and second input transistors;
first and second decoupling transistors coupled to the input transconductor; and
a variable current source.

4. The apparatus of claim 1 wherein the reference voltage is programmed to remain constant independent of temperature variations.

5. The apparatus of claim 1 wherein the Q-enhancement cell includes a pair of transistors having cross-coupled gates.

6. The apparatus of claim 1 further comprising a digital calibrator configured to calibrate the control signal outputted by the comparator into discrete output values.

7. The apparatus of claim 6 wherein the Q-enhancement cell includes a current digital-to-analog converter.

8. The apparatus of claim 1 wherein the output signal of the RF amplifier includes a differential output.

9. The apparatus of claim 1 wherein the output signal of the RF amplifier includes a positive output and a negative output.

10. The apparatus of claim 1 wherein the detector is configured to produce an output based on the input coupled to the output signal of the RF amplifier that is independent of temperature variations.

11. The apparatus of claim 1 wherein the RF amplifier is configured to produce the output signal with a constant amplitude independent of changes in a frequency of an input to the RF amplifier.

12. The apparatus of claim 1 wherein the output of the detector is an absolute value of the output signal of the RF amplifier.

13. The apparatus of claim 1 wherein a negative resistance of the Q-enhancement cell is a function of the bias current.

14. A method comprising:

determining a signal level of an RF amplifier output;
comparing a reference voltage to the determined signal level of the RF amplifier output; and
adjusting a bias current of a Q-enhancement cell coupled to the RF amplifier based on the comparing in order to maintain the signal level of the RF amplifier at a specific level.

15. The method of claim 14 further comprising maintaining the reference voltage at a constant value independent of temperature variations.

16. The method of claim 14 wherein the adjusting the bias current includes quantizing an output that is based on the comparing the reference voltage.

17. The method of claim 14 wherein the adjusting the bias current includes applying a voltage to a MOSFET.

18. The method of claim 14 wherein determining the signal level of the RF amplifier output includes receiving a differential output from the RF amplifier.

19. The method of claim 14 wherein the comparing the reference voltage to the determined signal level of the RF amplifier output is independent of temperature variations.

* * * * *